(12) United States Patent
Okamoto et al.

(10) Patent No.: US 10,355,242 B2
(45) Date of Patent: Jul. 16, 2019

(54) ELECTROLUMINESCENT DEVICE INCLUDING A PLURALITY OF SEALING FILMS

(71) Applicant: Sharp Kabushiki Kaisha, Osaka-shi, Osaka (JP)

(72) Inventors: Tetsuya Okamoto, Osaka (JP); Takeshi Hirase, Osaka (JP); Tohru Senoo, Osaka (JP); Tohru Sonoda, Osaka (JP); Wataru Nakamura, Osaka (JP)

( * ) Notice: Subject to any disclaimer, the term of this patent is extended or adjusted under 35 U.S.C. 154(b) by 158 days.

(21) Appl. No.: 14/786,689

(22) PCT Filed: Feb. 27, 2014

(86) PCT No.: PCT/JP2014/054840
§ 371 (c)(1),
(2) Date: Oct. 23, 2015

(87) PCT Pub. No.: WO2014/174892
PCT Pub. Date: Oct. 30, 2014

(65) Prior Publication Data
US 2016/0072099 A1    Mar. 10, 2016

(30) Foreign Application Priority Data
Apr. 25, 2013   (JP) .................. 2013-092035

(51) Int. Cl.
*H01L 51/52* (2006.01)
*C23C 16/04* (2006.01)
(Continued)

(52) U.S. Cl.
CPC ........ *H01L 51/5256* (2013.01); *C23C 16/042* (2013.01); *C23C 16/345* (2013.01);
(Continued)

(58) Field of Classification Search
CPC ............. H01L 51/5256; H01L 27/3244; H01L 51/5253; H01L 51/5266
(Continued)

(56) References Cited

U.S. PATENT DOCUMENTS

2004/0212759 A1* 10/2004 Hayashi ............. H01L 51/5253
349/84
2006/0088951 A1* 4/2006 Hayashi ............. H01L 51/5237
438/99
(Continued)

FOREIGN PATENT DOCUMENTS

JP          4-2766 A      1/1992
JP     2009-224231 A     10/2009
(Continued)

OTHER PUBLICATIONS

Official Communication issued in International Patent Application No. PCT/JP2014/054840, dated Apr. 1, 2014.

*Primary Examiner* — Lex H Malsawma
*Assistant Examiner* — Eric W Jones
(74) *Attorney, Agent, or Firm* — Keating & Bennett, LLP

(57) ABSTRACT

In an organic EL display device (electroluminescent device) including an organic EL element (electroluminescent element), a first sealing film covers the organic El element, a second sealing film is formed on the first sealing film, and a third sealing film covers the first sealing film and the second sealing film.

13 Claims, 13 Drawing Sheets

(51) Int. Cl.
  *H01L 51/56* (2006.01)
  *C23C 16/34* (2006.01)
  *C23C 16/36* (2006.01)
  *C23C 16/50* (2006.01)
  *C23C 16/44* (2006.01)
  *H01L 27/32* (2006.01)

(52) U.S. Cl.
  CPC .............. *C23C 16/36* (2013.01); *C23C 16/50* (2013.01); *H01L 51/5246* (2013.01); *H01L 51/5253* (2013.01); *H01L 51/5259* (2013.01); *H01L 51/56* (2013.01); *C23C 16/4405* (2013.01); *H01L 27/3244* (2013.01); *H01L 51/524* (2013.01); *H01L 2251/301* (2013.01)

(58) Field of Classification Search
  USPC ...................................... 257/40, 59
  See application file for complete search history.

(56) References Cited

U.S. PATENT DOCUMENTS

| | | | |
|---|---|---|---|
| 2007/0096631 A1* | 5/2007 | Sung | G02F 1/1339 313/498 |
| 2007/0172971 A1* | 7/2007 | Boroson | H01L 51/5246 438/26 |
| 2010/0213828 A1 | 8/2010 | Seo et al. | |
| 2011/0151200 A1* | 6/2011 | Erlat | H05B 33/04 428/192 |
| 2012/0107506 A1 | 5/2012 | Ukigaya et al. | |
| 2012/0206036 A1 | 8/2012 | Tanaka et al. | |
| 2013/0092972 A1* | 4/2013 | Kim | H01L 51/5256 257/100 |
| 2014/0021856 A1* | 1/2014 | Jung | H01L 51/5253 313/504 |
| 2014/0097430 A1* | 4/2014 | Park | H01L 27/1218 257/48 |
| 2014/0138634 A1* | 5/2014 | Lee | H01L 27/00 257/40 |

FOREIGN PATENT DOCUMENTS

| | | |
|---|---|---|
| JP | 2010-199064 A | 9/2010 |
| JP | 2012-92395 A | 5/2012 |
| JP | 2012-186153 A | 9/2012 |
| JP | 2012-190612 A | 10/2012 |
| JP | 2012-209209 A | 10/2012 |

* cited by examiner

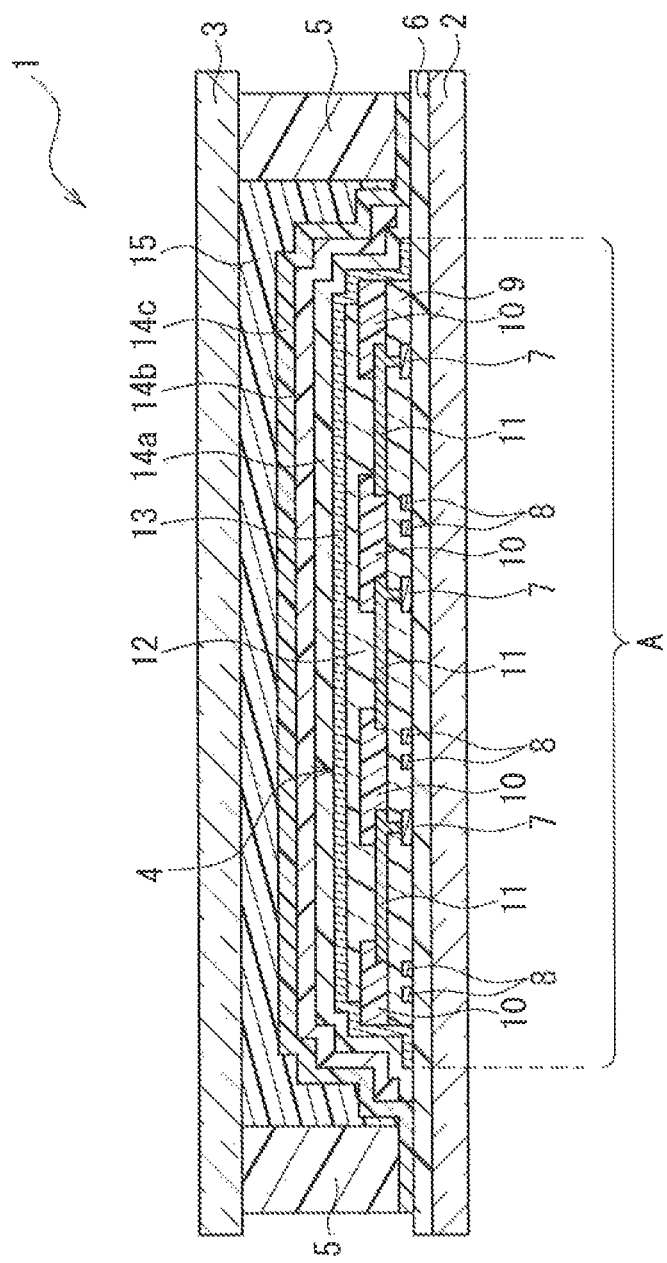
F I G. 1

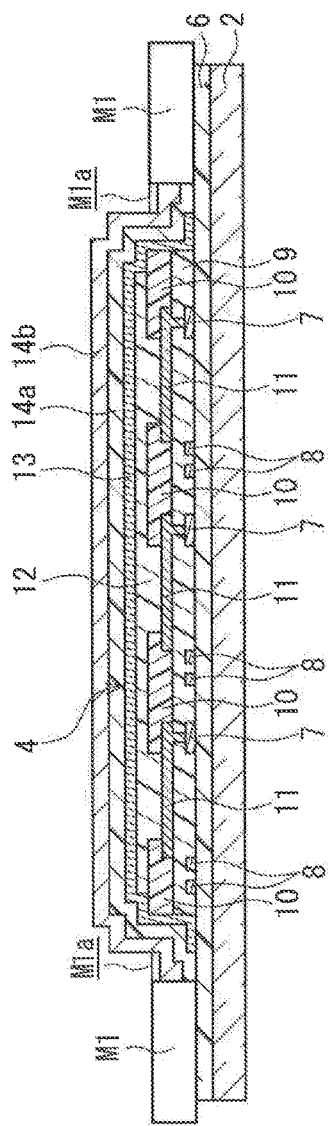
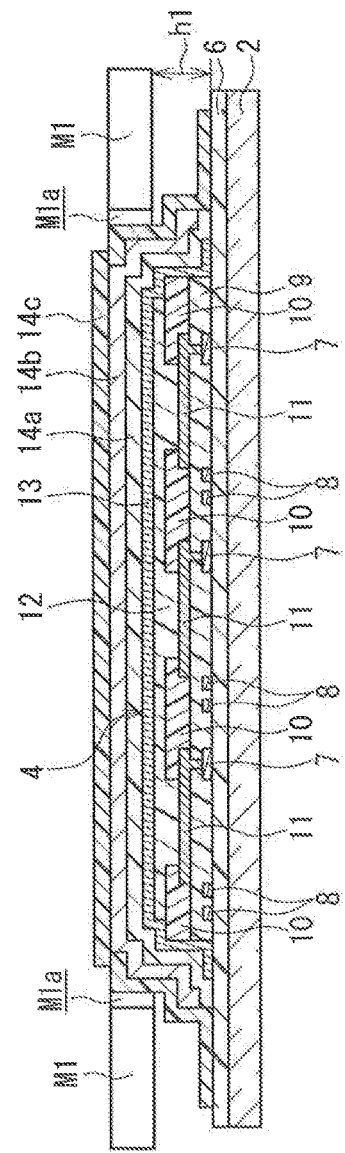
F I G. 5 (a)
F I G. 5 (b)

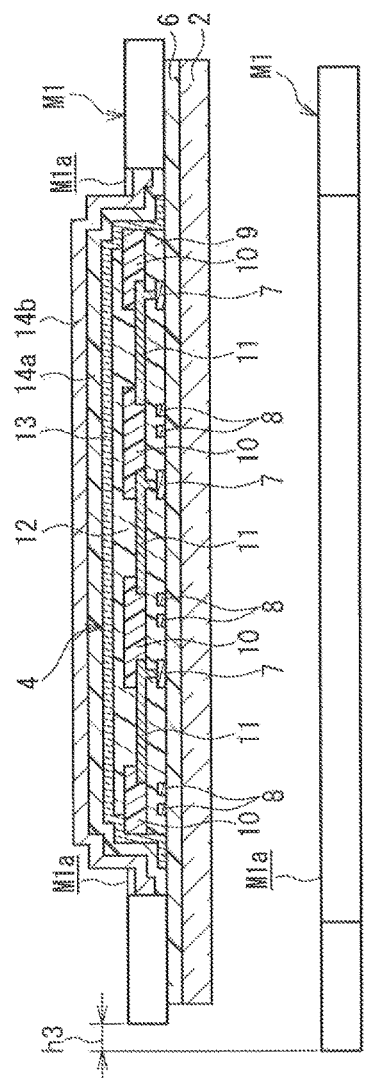
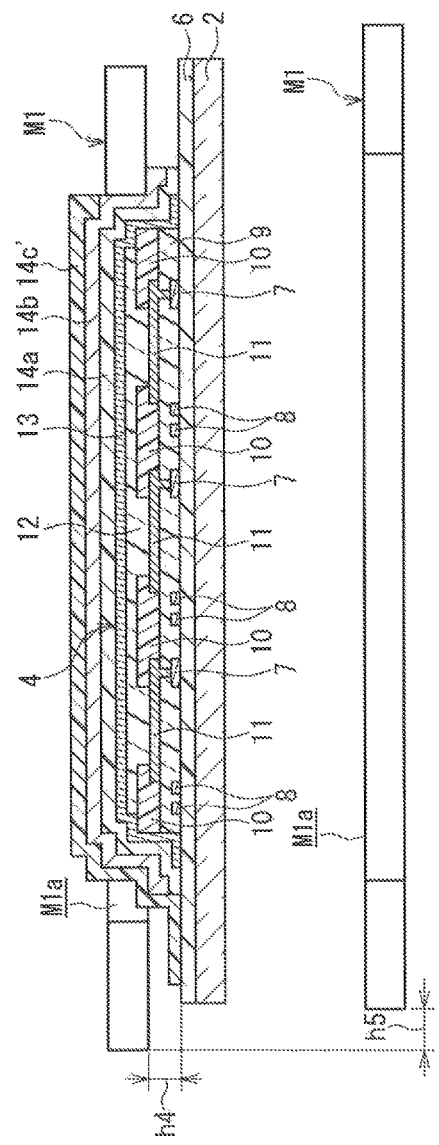
F I G. 10(a)
F I G. 10(b)

ELECTROLUMINESCENT DEVICE INCLUDING A PLURALITY OF SEALING FILMS

TECHNICAL FIELD

The present invention relates an electroluminescent device including an EL (electroluminescent) element, an apparatus for manufacturing the electroluminescent device, and a method for manufacturing the electroluminescent device.

BACKGROUND ART

In recent years, flat panel displays have been widely used in various commodities and fields, and the flat panel displays are required to have a larger size, a higher image quality, and a lower power consumption.

Under these circumstances, an organic EL display device is attracting considerable attention as an all-solid-state flat panel display with excellent low-voltage driving capability, high-speed responsibility, and self-luminous property. The organic EL display device includes an organic EL element that utilizes the electroluminescence of an organic material.

In an active matrix type organic EL display device, e.g., a thin-film organic EL element is provided on a substrate having TFTs (thin-film transistors). The organic EL element includes an organic EL layer (including a light emitting layer) that is disposed between a pair of electrodes. The TFTs are connected to one of the pair of electrodes. A voltage is applied across the pair of electrodes so that the light emitting layer emits light, thereby displaying images.

In the above conventional organic EL display device, it is known that a sealing film is formed on the organic EL element in order to prevent the degradation of the organic EL element due to moisture and oxygen. Moreover, a laminated film composed of an inorganic film and an organic film has been proposed as the sealing film.

Further, in an apparatus for manufacturing the conventional organic EL display device, the use of a plurality of masks has been proposed to form the laminated film, as described in, e.g., Patent Document 1.

PRIOR ART DOCUMENTS

Patent Documents

Patent Document 1: JP 2009-224231 A

DISCLOSURE OF INVENTION

Problem to be Solved by the Invention

However, in the apparatus for manufacturing the conventional organic El display device (electroluminescent device), different masks are used to form the corresponding sealing films of the laminated film. Therefore, the manufacturing apparatus is required to have mask stock chambers for storing the masks, and the function of transferring each of the masks from the mask stock chambers to film forming chambers. Thus, the manufacturing apparatus has a difficulty in reducing the cost of the organic EL display device, since it takes long time and high cost to manufacture the organic EL display device. The manufacturing apparatus also needs to have a space for the mask stock chambers.

Moreover, in the apparatus for manufacturing the conventional organic EL display device, it may not be possible to protect the organic EL element (electroluminescent element) from degradation due to moisture and oxygen. There are some cases where moisture and oxygen enter the organic EL element from the end faces of the laminated film, particularly the end faces of the organic film formed on the organic EL element. Consequently, it may be inevitable that the organic EL element will be degraded due to moisture and oxygen that has entered.

With the foregoing in mind, it is an object of the present invention to provide a low-cost electroluminescent device that can reliably prevent the degradation of an electroluminescent element due to moisture and oxygen, an apparatus for manufacturing the electroluminescent device, and a method for manufacturing the electroluminescent device.

Means for Solving Problem

To achieve the above object, an electroluminescent device of the present invention includes a substrate and an electroluminescent element provided on the substrate. The electroluminescent device includes a first sealing film that covers the electroluminescent element, a second sealing film that is formed on the first sealing film, and a third sealing film that covers the first sealing film and the second sealing film.

In the electroluminescent device having the above configuration, the electroluminescent element is covered with the first and second sealing films. Moreover, the first and second sealing films are covered with the third sealing film. Thus, unlike the conventional examples, the electroluminescent device can prevent moisture and oxygen from entering the electroluminescent element from the end faces of the laminated film, and therefore can reliably prevent the degradation of the electroluminescent element due to moisture and oxygen.

In the electroluminescent device, it is preferable that the third sealing film is formed of an inorganic film.

In this case, the inorganic film can easily prevent moisture and oxygen from entering the electroluminescent element from the end faces of the laminated film. This can more reliably prevent the degradation of the electroluminescent element due to moisture and oxygen.

In the electroluminescent device, it is preferable that the first sealing film and the third sealing film are formed of inorganic films, and the second sealing film is formed of an organic film.

In this case, each of the first to third sealing films can easily be made suitable.

The electroluminescent device preferably includes a counter substrate that is located on the opposite side of the electroluminescent element with respect to the substrate, and a sealing material in the form of a frame that seals the electroluminescent element between the substrate and the counter substrate.

This configuration can more reliably prevent the degradation of the electroluminescent element.

In the electroluminescent device, a desiccant layer may be provided between the substrate, the counter substrate, and the sealing material.

This configuration can more reliably prevent the adverse effect of moisture on the electroluminescent element.

An apparatus for manufacturing an electroluminescent device of the present invention provides an electroluminescent device including a substrate and an electroluminescent element provided on the substrate. The manufacturing apparatus includes the following: a film forming portion that forms at least two types of sealing films for sealing the electroluminescent element; a mask that is placed on the substrate when each of the at least two types of sealing films is formed by the film forming portion; and a mask moving member that moves the mask in at least a vertical direction of a vertical direction and a horizontal direction with respect to the substrate.

In the apparatus for manufacturing the electroluminescent device having the above configuration, the film forming portion forms at least two types of sealing films for sealing the electroluminescent element. Moreover, the mask is moved in at least the vertical direction of the vertical direction and the horizontal direction with respect to the substrate by the mask moving member, and used to form each of at least two types of sealing films. Thus, unlike the conventional examples, the manufacturing apparatus can easily reduce the cost of the electroluminescent device, and also can easily manufacture the electroluminescent device at a low cost. Since the mask moving member moves the mask in at least the vertical direction of the vertical direction and the horizontal direction with respect to the substrate, the sealing film of at least two types of sealing films that is farthest from the electroluminescent element can be formed so as to cover the end faces of the sealing films located inside the farthest sealing film. Thus, unlike the conventional examples, the manufacturing apparatus can prevent moisture and oxygen from entering the electroluminescent element from the end faces of the laminated film, and therefore can reliably prevent the degradation of the electroluminescent element due to moisture and oxygen.

In the manufacturing apparatus, the mask may have a plurality of openings, and electroluminescent elements provided on the substrate may be arranged within each of the plurality of openings.

In this case, one mask can be used to form the first to third sealing films simultaneously in a plurality of electroluminescent devices.

In the manufacturing apparatus, it is preferable that the mask moving member moves the mask at least upward from the substrate before another sealing film is formed to cover end faces of the sealing films that cover the electroluminescent element.

In this case, the sealing film can be formed to cover the end faces of the sealing films that cover the electroluminescent element. Thus, the manufacturing apparatus can prevent moisture and oxygen from entering the electroluminescent element from the end faces of the sealing films covering the electroluminescent element, and therefore can reliably prevent the degradation of the electroluminescent element due to moisture and oxygen.

In the manufacturing apparatus, it is preferable that the film forming portion forms each of the at least two types of sealing films by a CVD method.

This can prevent the structure of the manufacturing apparatus from being complicated, and make it easy to reduce the size of the manufacturing apparatus. Accordingly, an increase in the cost of the electroluminescent device can easily be suppressed.

A method for manufacturing an electroluminescent device of the present invention provides an electroluminescent device including a substrate and an electroluminescent element provided on the substrate. The manufacturing method includes the following: a first sealing film formation process in which a mask is placed on the substrate, and a first sealing film is formed to cover the electroluminescent element; a second sealing film formation process in which the mask is placed on the substrate, and a second sealing film is formed on the first sealing film; and a third sealing film formation process in which the mask is moved upward from the substrate, and then a third sealing film is formed using the mask to cover the first sealing film and the second sealing film.

In the method for manufacturing the electroluminescent device having the above configuration, since the first to third sealing films are formed using one mask, the manufacturing method can easily reduce the cost of the electroluminescent device, and also can easily manufacture the electroluminescent device at a low cost. Moreover, since the third sealing film is formed to cover the first and second sealing films, the manufacturing method can prevent moisture and oxygen from entering the electroluminescent element from the end faces of the laminated film, and therefore can reliably prevent the degradation of the electroluminescent element due to moisture and oxygen.

In the third sealing film formation process of the manufacturing method, the mask may be moved upward from the substrate and subsequently moved in a horizontal direction, and then the third sealing film may be formed using the mask to cover the first sealing film and the second sealing film.

In this case, the third sealing film can be formed by moving the mask upward and in the horizontal direction with respect to the substrate.

Effects of the Invention

The present invention can provide a low-cost electroluminescent device that can reliably prevent the degradation of an electroluminescent element due to moisture and oxygen, an apparatus for manufacturing the electroluminescent device, and a method for manufacturing the electroluminescent device.

BRIEF DESCRIPTION OF DRAWINGS

FIG. 1 is a cross-sectional view showing an organic EL display device of Embodiment 1 of the present invention.

FIG. 5 is a diagram for explaining the main manufacturing processes of the organic EL display device. FIGS. 5(a) to 5(b) illustrate a series of the main manufacturing processes.

FIGS. 6(a) to 6(b) illustrate a series of the main manufacturing processes performed after the manufacturing process shown in FIG. 5(b).

FIG. 10 is a diagram for explaining the main manufacturing processes in an apparatus for manufacturing an organic EL display device of Embodiment 3 of the present invention. FIGS. 10(a) to 10(b) illustrate a series of the main manufacturing processes.

DESCRIPTION OF THE INVENTION

Figure 2:
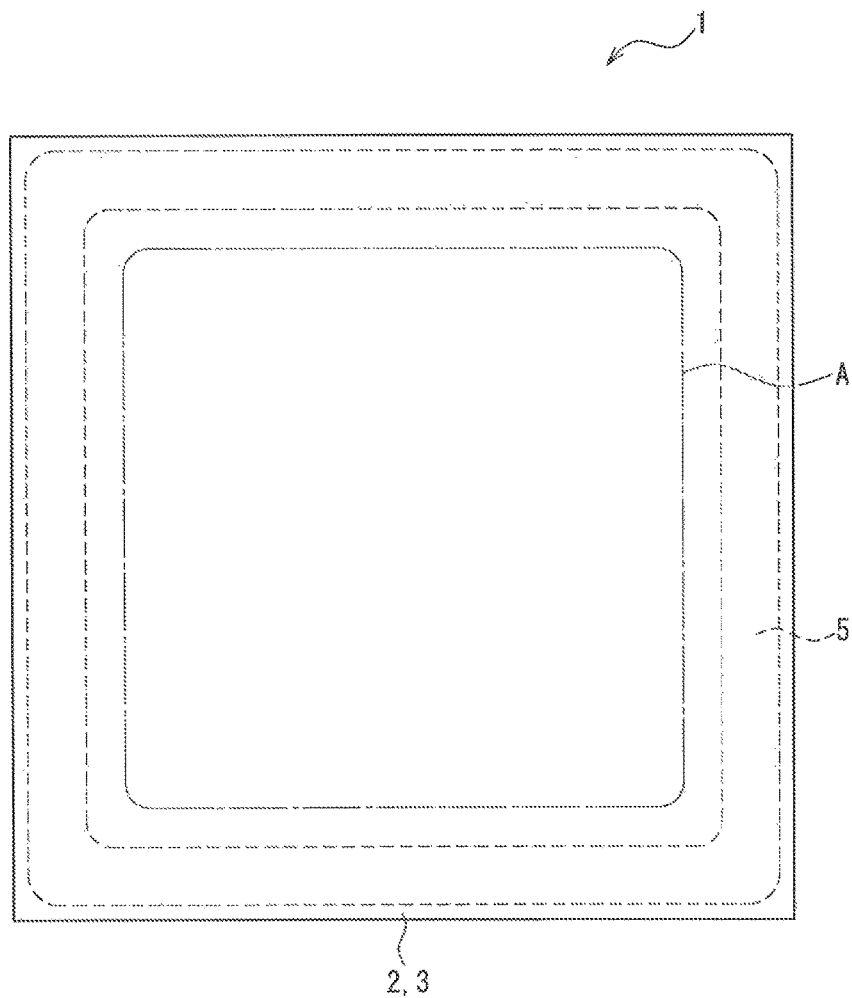
FIG. 2 is a top view of the organic EL display device.

Hereinafter, preferred embodiments of an electroluminescent device, an apparatus for manufacturing the electroluminescent device, and a method for manufacturing the electroluminescent device of the present invention will be described with reference to the drawings. In the following description, the present invention is applied to an organic EL display device. The size and size ratio of each of the constituent members in the drawings may not exactly represent those of the actual constituent members.

Embodiment 1

FIG. 1 is a cross-sectional view showing an organic EL display device of Embodiment 1 of the present invention. FIG. 2 is a top view of the organic EL display device. In FIG. 1, an organic EL, display device 1 of this embodiment includes a TFT substrate (substrate) 2 and an organic EL element (electroluminescent element) 4 provided on the TFT substrate 2. The organic EL element 4 is sealed by the TFT substrate 2, a counter substrate 3 located opposite to the TFT substrate 2, and a sealing material 5 provided between the TFT substrate 2 and the counter substrate 3.

Referring also to FIG. 2, in the organic EL display device 1 of this embodiment, the organic EL element 4 forms a pixel region A having a plurality of pixels, and the organic EL element 4 is provided in a space surrounded by the TFT substrate 2, the counter substrate 3, and the sealing material 5 in the form of a frame. The pixel region A is a display portion of the organic EL display device 1 and displays information.

Referring back to FIG. 1, the TFT substrate 2 and the counter substrate 3 are made of, e.g., a glass material. An underlying film (insulating film) 6 is formed on the TFT substrate 2 to cover the entire surface of the TFT substrate 2. TFTs (thin film transistors) 7 are provided on the underlying film 6 so as to correspond to each pixel in the pixel region A. Moreover, lines 8 are formed on the underlying film 6, which include a plurality of source lines (signal lines) and a plurality of gate lines that are arranged in a matrix. The source lines are connected to a source driver (not shown) and the gate lines are connected to a gate driver (not shown). With this configuration, the TFTs 7 are driven on a pixel-by-pixel basis in accordance with an external input image signal. The TFTs 7 function as switching elements that control the light emission of the corresponding pixels. Thus, the TFTs 7 control the light emission of any of red (R), green (G), and blue (B) pixels of the organic EL element 4.

The underlying film 6 prevents the properties of the TFTs 7 from being reduced due to the diffusion of impurities from the TFT substrate 2 to the TFTs 7. If there is no concern for such a reduction in the properties of the TFTs 7, then the formation of the underlying film 6 may be omitted.

An interlayer insulating film 9, an edge cover 10, and a first electrode 11 of the organic EL, element 4 are formed on the TFT substrate 2. The interlayer insulating film 9 functions as a planarization film and is formed on the underlying film 6 to cover the TFTs 7 and the lines 8. The edge cover 10 is formed on the interlayer insulating film 9 to cover the pattern edges of the first electrode 11. The edge cover 10 also functions as an insulating layer to prevent a short circuit between the first electrode 11 and a second electrode 13 (as will be described later). Moreover, the first electrode 11 is connected to the TFTs 7 via contact holes provided in the interlayer insulating film 9.

The edge cover 10 has openings, through which the first electrode 11 is exposed, and these portions substantially form light emitting regions of the organic EL element 4. As described above, the organic EL display device 1 of this embodiment is configured to perform full-color display by emitting light of any color of RGB.

An organic EL layer 12 and a second electrode 13 are formed on the first electrode 11. The first electrode 11, the organic EL layer 12, and the second electrode 13 constitute the organic EL element 4. The organic EL element 4 is, e.g., a light emitting element that is driven by low voltage direct current and can emit high-intensity light. The organic EL element 4 includes the first electrode 11, the organic EL layer 12, and the second electrode 13.

Specifically, when the first electrode 11 is a positive electrode, a hole injection layer, a hole transport layer, a light emitting layer, an electron transport layer, an electron injection layer, etc. (not shown) are formed in this order on the first electrode 11 as the organic EL layer 12, on top of which the second electrode (negative electrode) 13 is formed. Other than the above description, a single layer may have two or more functions such as a hole injection and transport layer. Moreover, a carrier blocking layer or the like may be appropriately inserted into the organic EL layer 12.

On the other hand, when the second electrode 13 is a positive electrode, the order in which the layers are stacked as the organic EL layer 12 is reversed.

When the first electrode 11 is a permeable electrode or a semi-permeable electrode, and the second electrode 13 is a reflecting electrode, the organic EL display device 1 is a bottom emission type device that emits light from the TFT substrate 2. On the contrary, when the first electrode 11 is a reflecting electrode, and the second electrode 13 is a permeable electrode or a semi-permeable electrode, the organic EL display device 1 is a top emission type device that emits light from the counter substrate 3.

In the organic EL display device 1 of this embodiment, the organic EL element 4 is sealed by the TFT substrate 2, the counter substrate 3, and the sealing material 5, as described above. The sealing material 5 is formed of a resin such as an epoxy resin in which a spacer and inorganic particles are dispersed. The spacer is used to define a cell gap between the TFT substrate 2 and the counter substrate 3. As shown in FIG. 2, the sealing material 5 is in the form of a frame around the pixel region A. Due to the dispersion of the inorganic particles, the water vapor permeability of the sealing material 5 can be reduced further.

In the organic EL display device 1 of this embodiment, as shown in FIG. 1, a first sealing film 14a is formed to cover the organic EL element 4. Moreover, a second sealing film 14b is formed on the first sealing film 14a, and a third sealing film 14c is formed to cover the first sealing film 14a and the second sealing film 14b. The first to third sealing films 14a to 14c constitute a protective film that protects the organic EL element 4 from damage caused by foreign matters during the preparation of a desiccant layer 15 (as will be described later) and damage caused by the entering of moisture and oxygen from the outside before the preparation of the desiccant layer 15.

Specifically, the first sealing film 14a may be an inorganic film such as SiN and is formed, e.g., to a thickness of about 100 nm to 1000 nm. The second sealing film 14b may be an organic film such as SiCN and is formed, e.g., to a thickness of about 1000 nm to 5000 nm. The third sealing film 14c may be an inorganic film such as SiN and is formed, e.g., to a thickness of about 100 nm to 1000 nm.

In the organic EL display device 1 of this embodiment, since the first sealing film 14a is an inorganic film, it is possible to prevent moisture (including moisture contained in the second sealing film 14b) and oxygen from entering the organic EL element 4 from the outside. Since the second sealing film 14b is an organic film, it is possible to smooth the unevenness such as pinholes present in the first sealing film 14a. Since the third sealing film 14c is an inorganic film, it is possible to prevent moisture and oxygen from entering the organic EL element 4 via the end faces of the first sealing film 14a or the second sealing film 14b (particularly the second sealing film 14b) from the outside.

In the organic EL display device 1 of this embodiment, the first to third sealing films 14a to 14c are formed on the TFT substrate 2 using one mask, as will be described in detail later. The third sealing film 14c is interposed between the sealing material 5 and the underlying film 6. Other than the above description, the third sealing film 14c may be provided inside the sealing material 5, and this sealing material 5 may be formed on the underlying film 6.

In the organic EL display device 1 of this embodiment, the desiccant layer 15 is provided on the organic EL element 4 via the third sealing film 14c. That is, the desiccant layer 15 is provided to cover the organic EL element 4 between the TFT substrate 2 and the counter substrate 3. The desiccant layer 15 is formed of a resin in which activated carbon and metal oxides such as aluminum hydroxide and calcium oxide are dispersed.

Next, referring to FIGS. 3 and 4, an apparatus for manufacturing the organic EL display device 1 of this embodiment will be described in detail. The following description is mainly about a manufacturing apparatus for forming the first to third sealing films 14a to 14c.

Figure 3:
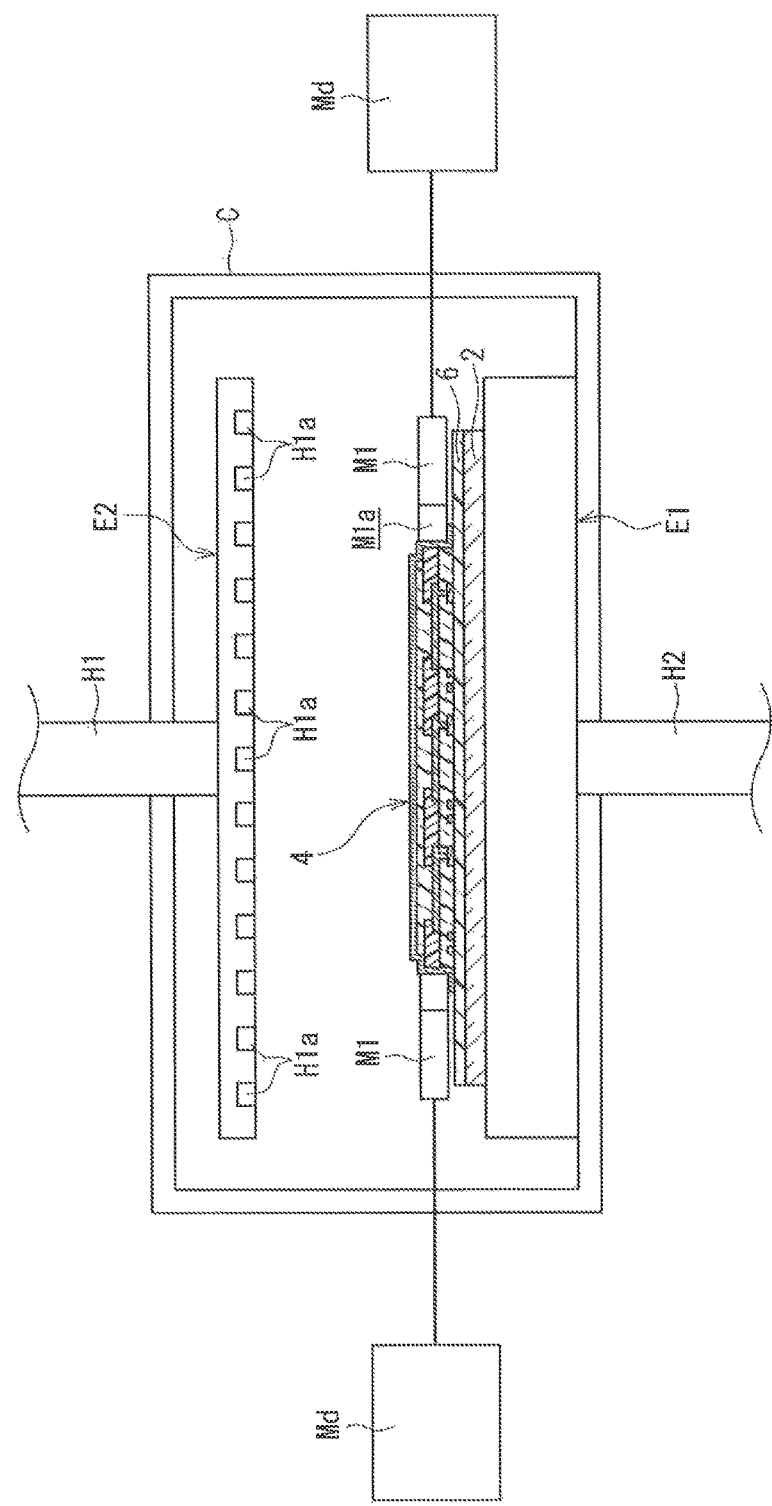
FIG. 3 is a diagram for explaining the main configuration of an apparatus for manufacturing an organic EL display device of Embodiment 1 of the present invention.
Figure 4:
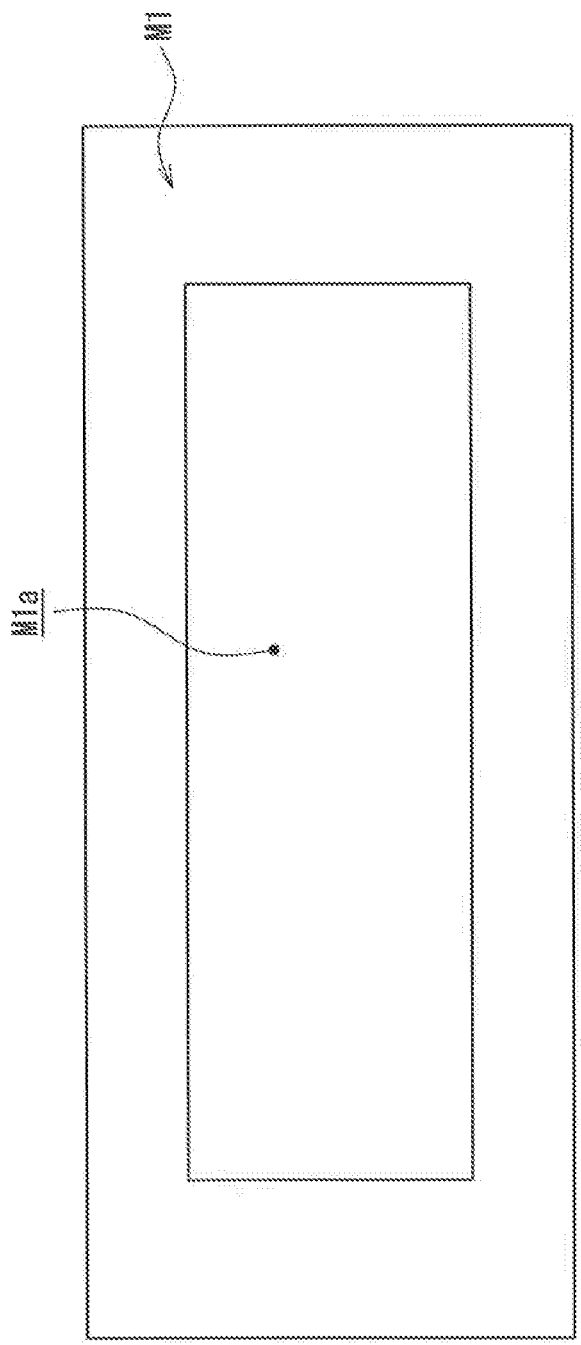
FIG. 4 is a plan view for explaining a mask shown in FIG. 3.

FIG. 3 is a diagram for explaining the main configuration of an apparatus for manufacturing the organic EL display device of Embodiment 1 of the present invention. FIG. 4 is a plan view for explaining a mask shown in FIG. 3.

The apparatus for manufacturing the organic EL display device 1 of this embodiment includes a film forming chamber C shown in FIG. 3. The first to third sealing films 14a to 14c are sequentially formed in the film forming chamber C. The film forming chamber C has a first electrode E1 on the lower side and a second electrode E2, which faces to the first electrode E1 on the other side. The TFT substrate 2, on which the underlying film 6 and the organic EL element 4 have been formed, is disposed on the first electrode E1. The second electrode E2 is provided with a gas supply portion H1 that supplies a film forming gas and a cleaning gas. The gas supply portion H1 includes a plurality of gas supply holes H1a through which the above gases are supplied. The gas supply holes H1a are formed in the surface of the second electrode E2 that faces the first electrode E1. The first electrode E1 is provided with a vacuum exhaust portion H2 that maintains a vacuum atmosphere in the film forming chamber C.

In the film forming chamber C, the first electrode E1, the second electrode E2, the gas supply portion H1 with the gas supply holes H1a, and the vacuum exhaust portion H2 constitute a film forming portion that forms at least two types of sealing films for sealing the electroluminescent element.

A mask M1 is provided above the first electrode E1. As shown in FIG. 4, the mask M1 has an opening M1a, and the organic EL element 4 provided on the TFT substrate 2 is arranged within the opening M1a.

Referring back to FIG. 3, a mask moving member Md is connected to the mask M1 and moves the mask M1 in at least the vertical direction of the vertical direction and the horizontal direction with respect to the TFT substrate (substrate) 2 on the first electrode E1. In the film forming chamber C, the first to third sealing films 14a to 14c are sequentially formed on the TFT substrate 2 having the organic EL element 4 by a (plasma) CVD (chemical vapor deposition) method.

Specifically, when the first and third sealing films 14a, 14c are made of, e.g., SiN, a voltage is applied to the first electrode E1 and the second electrode E2 while $SiH_4$ and $NH_3$ are supplied as film forming gases from the gas supply holes H1a. When the second sealing film 14b is made of, e.g., SiCN, a voltage is applied to the first electrode E1 and the second electrode E2 while $SiH_4$, $NH_3$, and $C_2H_2$ are supplied as film forming gases from the gas supply holes H1a. Moreover, the mask M1 is placed on the TFT substrate 2 (underlying film 6) for the formation of the first and second sealing films 14a, 14b, and the mask M1 is moved upward from the TFT substrate 2 for the formation of the third sealing film 14c (as will be described in detail later).

The cleaning gas may be, e.g., $NF_3$ and is supplied from the gas supply holes H1a during the cleaning of the film forming chamber C. The underlying film 6 and each portion of the organic EL element 4 are formed on the TFT substrate 2, e.g., in an vacuum atmosphere by a manufacturing portion (not shown) of the manufacturing apparatus.

Figure 6:
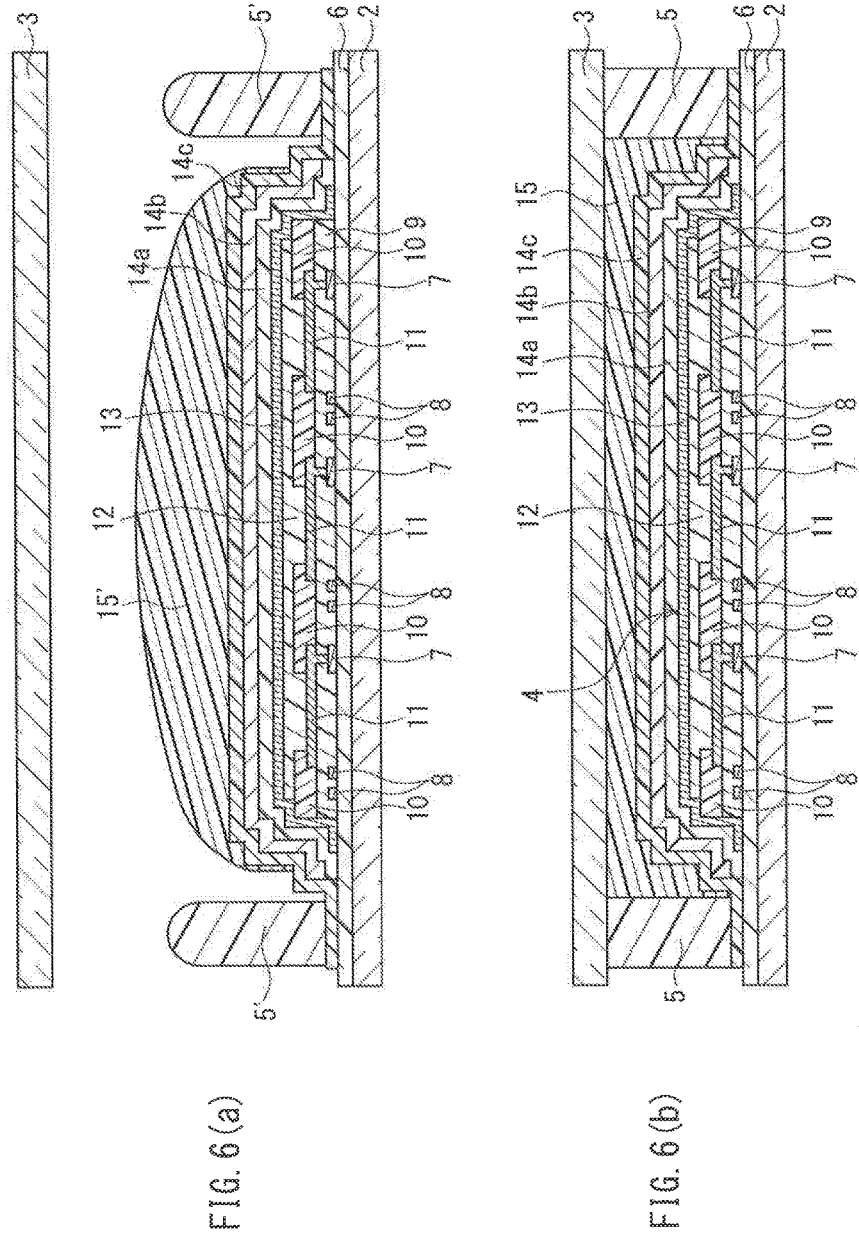
FIG. 6 is a diagram for explaining the main manufacturing processes of the organic EL display device.

Next, referring to FIGS. 5 and 6, a method for manufacturing the organic EL display device 1 of this embodiment will be described in detail. The following description is mainly about processes after the formation of the first to third sealing films 14a to 14c in the film forming chamber C.

FIG. 5 is a diagram for explaining the main manufacturing processes of the organic EL display device. FIGS. 5(a) to 5(b) illustrate a series of the main manufacturing processes. FIG. 6 is a diagram for explaining the main manufacturing processes of the organic EL display device. FIGS. 6(a) to 6(b) illustrate a series of the main manufacturing processes performed after the manufacturing process shown in FIG. 5(b).

As shown in FIG. 5(a), a first sealing film formation process and a second sealing film formation process are performed continuously. Specifically, the mask M1 is placed on the underlying film 6 of the TFT substrate 2 so that the organic EL element 4 is arranged within the opening M1a, as shown in FIG. 5(a). Then, in the film forming chamber C, the first sealing film formation process is performed to form a first sealing film 14a that covers the organic EL element 4. Subsequently, in the film forming chamber C, the second sealing film formation process is performed without moving the mask M1 to form a second sealing film 14b on the first sealing film 14a.

Next, as shown in FIG. 5(b), the mask M1 is moved upward to a predetermined height h1 (of, e.g., 0.1 mm to 0.5 mm) from the underlying film 6 by the mask moving member Md (see FIG. 3). Then, in the film forming chamber C, a third sealing film formation process is performed using the mask M1 to form a third sealing film 14c that covers the first and second sealing films 14a, 14b. In other words, the mask moving member Md (see FIG. 3) moves the mask M1 at least upward from the TFT substrate 2 before another sealing film (i.e., the third sealing film 14c) is formed to cover the end faces of the sealing films (i.e., the first and second sealing films 14a, 14b) that cover the organic EL element 4 in the third sealing film formation process. Moreover, in the third sealing film formation process, the film forming gas from the gas supply holes H1a (see FIG. 3) passes through the opening M1a of the mask M1 and the outside of the mask M1, and thus the third sealing film 14c is formed on the second sealing film 14b and the underlying film 6 to cover the first and second sealing films 14a, 14b.

Next, as shown in FIG. 6(a), a sealing material 5' is applied to the surface of the TFT substrate 2 that faces the counter substrate 3, e.g., with a nozzle dispenser to form a frame (annularly) surrounding the pixel region A (see FIG. 1). Then, a desiccant layer 15' is applied dropwise to the third sealing film 14c. The dropping amount is determined in accordance with the volume of the desiccant layer 15' to be sealed. The application of the desiccant layer 15' may be performed, e.g., by a liquid crystal dropping method (ODF (one drop filling) method).

Subsequently, as shown in FIG. 6(b), the TFT substrate 2 and the counter substrate 3 are bonded together in a vacuum, e.g., by a vacuum bonding apparatus (not shown). Thus, the sealing material 5 and the desiccant layer 15 are brought into close contact with the surface of the counter substrate 3. Then, under atmospheric pressure, the sealing material 5 is exposed to UV radiation, fired, and cured. Consequently, the organic EL display device 1 of this embodiment is completed.

Other than the above description, the sealing material 5' and the desiccant layer 15' may be provided on the surface of the counter substrate 3 that faces the TFT substrate 2, and then the TFT substrate 2 and the counter substrate 3 may be bonded together.

In the organic EL display device 1 of this embodiment having the above configuration, the organic EL element (electroluminescent element) 4 is covered with the first and second sealing films 14a, 14b. Moreover, the first and second sealing films 14a, 14b are covered with the third sealing film 14c. Thus, unlike the conventional examples, the organic EL display device 1 of this embodiment can prevent moisture and oxygen from entering the organic EL element 4 from the end faces of the laminated film, and therefore can reliably prevent the degradation of the organic EL element 4 due to moisture and oxygen.

In this embodiment, the counter substrate 3 is located on the opposite side of the organic EL element 4 with respect to the TFT substrate (substrate) 2, and the sealing material 5 in the form of a frame seals the organic EL element 4 between the TFT substrate 2 and the counter substrate 3. Thus, this embodiment can more reliably prevent the degradation of the organic EL element 4.

In this embodiment, the desiccant layer 15 is provided between the TFT substrate 2, the counter substrate 3, and the sealing material 5. Thus, this embodiment can more reliably prevent the adverse effect of moisture on the organic EL element 4.

In the apparatus for manufacturing the organic EL display device 1 of this embodiment, the first electrode E1, the second electrode E2, the gas supply portion H1 with the gas supply holes H1a, and the vacuum exhaust portion H2 are provided in the film forming chamber C and constitute the film forming portion that forms at least two types of sealing films (i.e., the first and third sealing files 14a, 14c and the second sealing film 14b) for sealing the organic EL element 4. The apparatus for manufacturing the organic EL display device 1 of this embodiment includes the mask M1 that is placed on the TFT substrate 2 when each of at least two types of sealing films is formed by the film forming portion. The apparatus for manufacturing the organic EL display device of this embodiment further includes the mask moving member Md that moves the mask M1 in at least the vertical direction of the vertical direction and the horizontal direction with respect to the TFT substrate 2. With this configuration, the film forming portion forms at least two types of sealing films (i.e., the first and third sealing files 14a, 14c and the second sealing film 14b) for sealing the organic EL element 4. Moreover, the mask M1 is moved in at least the vertical direction of the vertical direction and the horizontal direction with respect to the TFT substrate 2 by the mask moving member Md, and used to form each of at least two types of sealing films. Thus, unlike the conventional examples, the apparatus for manufacturing the organic EL display device 1 of this embodiment can easily reduce the cost of the organic EL display device 1, and also can easily manufacture the organic EL display device 1 at a low cost. Since the mask moving member Md moves the mask M1 in at least the vertical direction of the vertical direction and the horizontal direction with respect to the TFT substrate 2, the sealing film (i.e., the third sealing film 14c) of at least two types of sealing films that is farthest from the organic EL element 4 can be formed so as to cover the end faces of the sealing films located inside the farthest sealing film. Thus, unlike the conventional examples, the apparatus for manufacturing the organic EL display device 1 of this embodiment can prevent moisture and oxygen from entering the organic EL element 4 from the end faces of the laminated film, and therefore can reliably prevent the degradation of the organic EL element 4 due to moisture and oxygen.

In this embodiment, the film forming portion forms each of at least two types of sealing films by the CVD method. Thus, this embodiment can prevent the structure of the manufacturing apparatus from being complicated, and make it easy to reduce the size of the manufacturing apparatus. Accordingly, an increase in the cost of the organic EL display device 1 can easily be suppressed.

The method for manufacturing the organic EL display device 1 of this embodiment includes the first sealing film formation process, the second sealing film formation process, and the third sealing film formation process. In the first sealing film formation process, the mask M1 is placed on the TFT substrate 2, and the first sealing film 14a is formed to cover the organic El element 4. In the second sealing film formation process, the mask M1 is placed on the TFT substrate 2, and the second sealing film 14b is formed on the first sealing film 14a. In the third sealing film formation process, the mask M1 is moved upward from the TFT substrate 2 (i.e., the mask M1 is separated from the TFT substrate 2), and then the third sealing film 14c is formed using the mask M1 to cover the first and second sealing films 14a, 14b. In this manner, since the first to third sealing films 14a to 14c are formed using one mask M1, the method for manufacturing the organic EL display device 1 of this embodiment can easily reduce the cost of the organic EL display device 1, and also can easily manufacture the organic EL display device 1 at a low cost. Moreover, since the third sealing film 14c is formed to cover the first and second sealing films 14a, 14b, the method for manufacturing the organic EL display device 1 of this embodiment can prevent moisture and oxygen from entering the organic EL element 4 from the end faces of the laminated film, and therefore can reliably prevent the degradation of the organic EL element 4 due to moisture and oxygen.

Other than the above description, the desiccant layer 15 may include metal particles of iron, aluminum or the like and an oxygen absorbent such as an easily oxidizable organic material.

Embodiment 2

Figure 7:
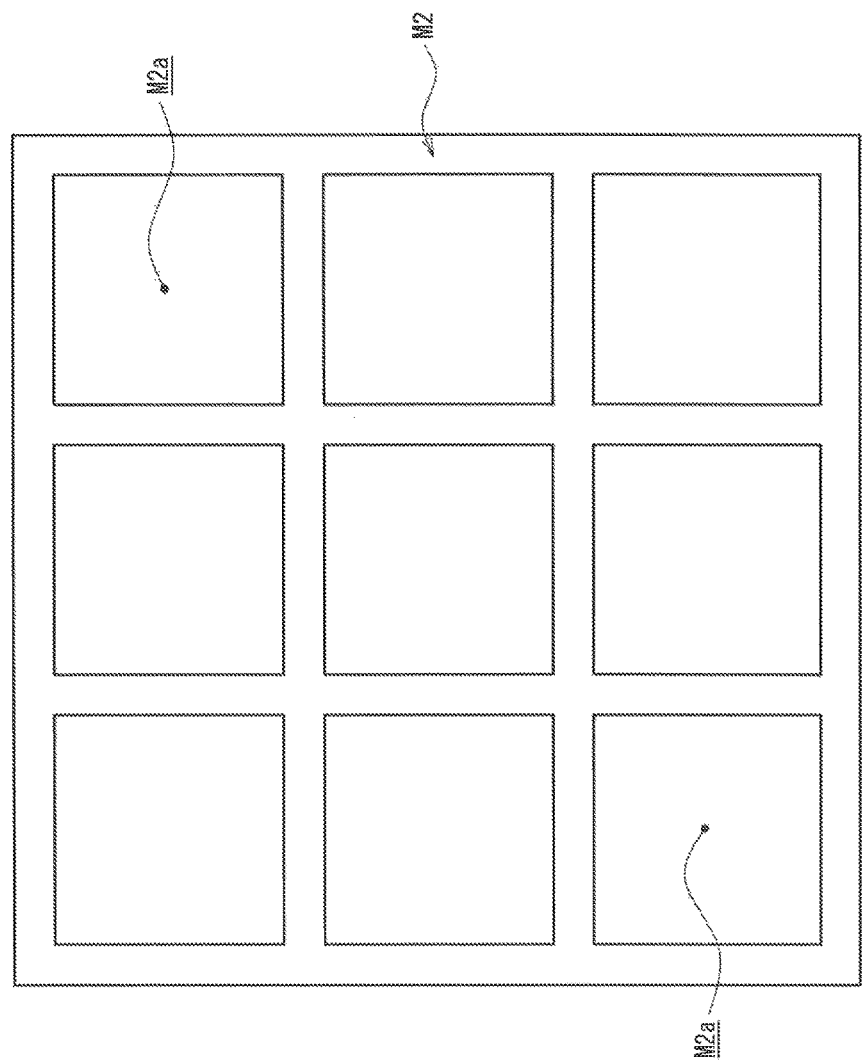
FIG. 7 is a plan view for explaining a mask used in an apparatus for manufacturing an organic EL display device of Embodiment 2 of the present invention.
Figure 8:
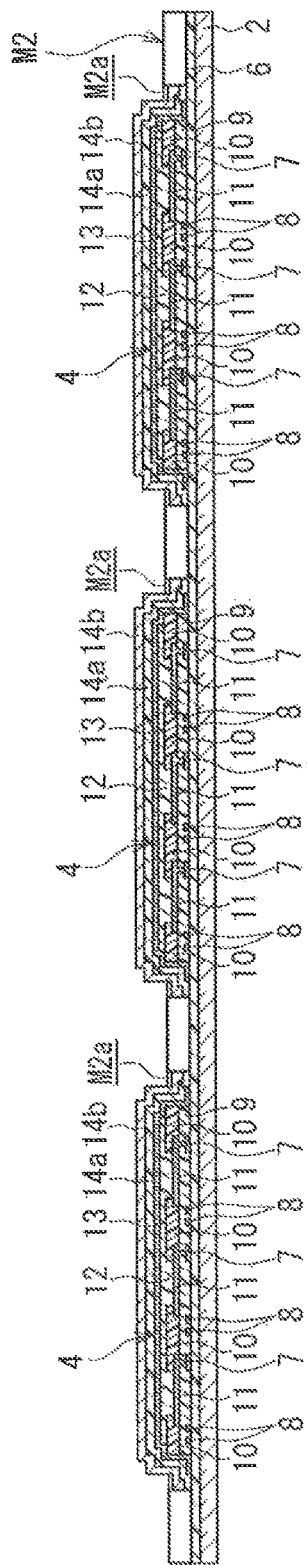
FIG. 8 is a diagram for explaining the main manufacturing process of an organic EL display device using the mask shown in FIG. 7.
Figure 9:
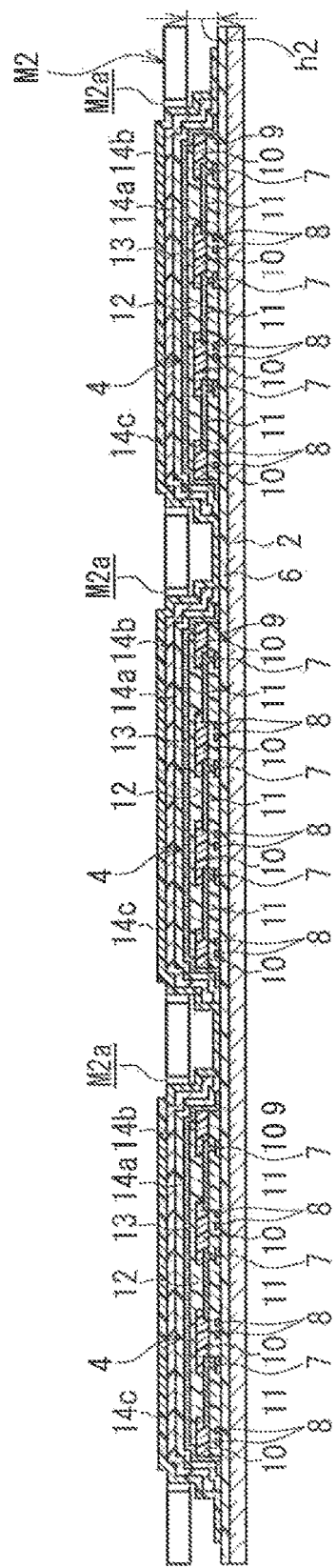
FIG. 9 is a diagram for explaining the main manufacturing process of the organic EL display device using the mask shown in FIG. 7, which is performed after the manufacturing process shown in FIG. 8.

FIG. 7 is a plan view for explaining a mask used in an apparatus for manufacturing an organic EL display device of Embodiment 2 of the present invention. FIG. 8 is a diagram for explaining the main manufacturing process of an organic EL display device using the mask shown in FIG. 7. FIG. 9 is a diagram for explaining the main manufacturing process of the organic EL display device using the mask shown in FIG. 7, which is performed after the manufacturing process shown in FIG. 8.

In FIGS. 7 to 9, this embodiment mainly differs from Embodiment 1 in that a mask having a plurality of openings is used, and electroluminescent elements provided on a TFT substrate are arranged within each of the openings. The same components as those of Embodiment 1 are denoted by the same reference numerals, and the explanation will not be repeated.

As shown in FIG. 7, an apparatus for manufacturing the organic EL display device 1 of this embodiment uses a mask M2 having a plurality of (e.g., nine) openings M2a. Like the mask of Embodiment 1, the mask M2 is connected to the mask moving member Md in the film forming chamber C. The mask M2 can be moved in at least one direction of the vertical direction and the horizontal direction with respect to the TFT substrate 2 by the mask moving member Md. In the apparatus for manufacturing the organic EL display device 1 of this embodiment, the first to third sealing films 14a to 14c can be formed on up to 9 organic EL elements 4 using the mask M2.

Specifically, as shown in FIG. 8, the mask M2 is placed on the underlying film 6 of the TFT substrate 2 so that the organic EL elements 4 are arranged within three openings M2a, respectively. Then, in the film forming chamber C, a first sealing film formation process is performed to form a first sealing film 14a that covers each of the organic EL elements 4. Subsequently, in the film forming chamber C, a second sealing film formation process is performed without moving the Mask M2 to form a second sealing film 14b on the first sealing film 14a.

Next, as shown in FIG. 9, the mask M2 is moved upward to a predetermined height h2 (of, e.g., 0.1 mm to 0.5 mm) from the underlying film 6 by the mask moving member Md (see FIG. 3). Then, in the film forming chamber C, a third sealing film formation process is performed using the mask M2 to form a third sealing film 14c that covers the first and second sealing films 14a, 14b. In the third sealing film formation process, the film forming gas from the gas supply holes H1a (see FIG. 3) passes through the openings M2a of the mask M2 and the outside of the mask M2, and thus the third sealing film 14c is formed on the second sealing film 14b and the underlying film 6 to cover the first and second sealing films 14a, 14b for each of the organic EL elements 4.

With the above configuration, this embodiment can have the same effects as those of Embodiment 1. In this embodiment, the mask M2 has a plurality of openings M2a, and the organic EL elements 4 provided on the TFT substrate 2 are arranged within each of the openings M2a. Thus, one mask M2 can be used to form the first to third sealing films 14a to 14c simultaneously in a plurality of organic EL display devices 1.

Embodiment 3

Figure 11:
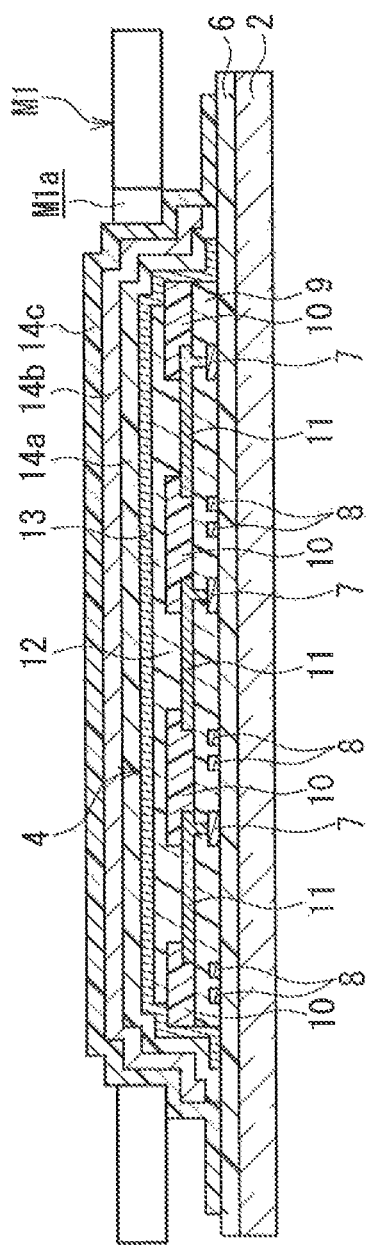
FIG. 11 is a diagram for explaining the main manufacturing process of the organic EL, display device, which is performed after the manufacturing processes shown in FIG. 10.

FIG. 10 is a diagram for explaining the main manufacturing processes in an apparatus for manufacturing an organic EL display device of Embodiment 3 of the present invention. FIGS. 10(*a*) to 10(*b*) illustrate a series of the main manufacturing processes. FIG. 11 is a diagram for explaining the manufacturing process of the organic EL display device, which is performed after the manufacturing processes shown in FIG. 10.

In FIGS. 10 and 11, this embodiment mainly differs from Embodiment 1 in that a third sealing film is formed by moving a mask in both the vertical direction and the horizontal direction with respect to a TFT substrate. The same components as those of Embodiment 1 are denoted by the same reference numerals, and the explanation will not be repeated.

As shown in FIG. 10(*a*), in the organic EL display device 1 of this embodiment, like Embodiment 1, a first sealing film formation process and a second sealing film formation process are performed continuously. Specifically, the mask M1 is placed on the underlying film 6 of the TFT substrate 2 so that the organic EL element 4 is arranged within the opening M1a, as shown in FIG. 10(*a*). Then, in the film forming chamber C, the first sealing film formation process is performed to form a first sealing film 14a that covers the organic EL element 4. Subsequently, in the film forming chamber C, the second sealing film formation process is performed without moving the mask M1 to form a second sealing film 14b on the first sealing film 14a.

Next, as shown in FIG. 10(*b*), the mask M1 is moved upward to a predetermined height h4 (of, e.g., 0.1 mm to 0.5 mm) from the underlying film 6 by the mask moving member Md (see FIG. 3). Then, as shown in FIG. 10(*a*), the mask M1 is moved to the left by a predetermined distance h3 (of, e.g., 2 mm to 3 mm) with respect to the TFT substrate 2 by the mask moving member Md (see FIG. 3). Thus, as shown in FIG. 10(*b*), the mask M1 is placed on the second sealing film 14b while the inner surface of the opening M1a on the right is in contact with the side of the second sealing film 14b. Then, in the film forming chamber C, a first half of the third sealing film formation process is performed using the mask M1 to form a third sealing film 14c' that covers the first and second sealing films 14a, 14b. In the first half of the third sealing film formation process, the film forming gas from the gas supply holes H1a (see FIG. 3) passes through the opening M1a of the mask M1 and the outside of the mask M1, and thus the third sealing film 14c' is formed on the second sealing film 14b and the underlying film 6 to cover the first and second sealing films 14a, 14b.

However, in the first half of the third sealing film formation process, the mask M1 is placed on the second sealing film 14b while the inner surface of the opening M1a on the right is in contact with the side of the second sealing film 14b, as shown in FIG. 10(*b*). Therefore, the third sealing film 14c' is not formed on the right-side portions of the second sealing film 14b and the underlying film 6 so as to cover the right end faces of the first and second sealing films 14a, 14b, although the third sealing film 14c' is formed on the left-side portions of the second sealing film 14b and the underlying film 6 so as to cover the left end faces of the first and second sealing films 14a, 14b, as shown in FIG. 10(*b*).

Thereafter, as shown in FIG. 10(b), the mask M1 is moved to the right by a predetermined distance h5 (of, e.g., 2 mm to 3 mm) with respect to the TFT substrate 2 by the mask moving member Md (see FIG. 3). Thus, as shown in FIG. 11, the mask M1 is placed on the third sealing film 14c while the inner surface of the opening M1a on the left is in contact with the side of the third sealing film 14c. Then, in the film forming chamber C, a second half of the third sealing film formation process is performed using the mask M1 to from a third sealing film 14c that covers the first and second sealing films 14a, 14b. In the second half of the third sealing film formation process, the film forming gas from the gas supply holes H1a (see FIG. 3) passes through the opening M1a of the mask M1 and the outside of the mask M1, and thus the third sealing film 14c is formed on the right-side portions of the second sealing film 14b and the underlying film 6 so as to cover the right end faces of the first and second sealing films 14a, 14b.

With the above configuration, this embodiment can have the same effects as those of Embodiment 1.

The above embodiments are all illustrative and not restrictive. The technical scope of the present invention is defined by the appended claims, and all changes that come within the range of equivalency of the claims are intended to be embraced therein.

In the above description, the organic EL element is used as an electroluminescent element. However, the present invention is not limited thereto, and may use, e.g., an inorganic EL element including an inorganic compound.

In the above description, the present invention is applied to the organic EL display device. However, the present invention is not limited thereto, and may be applied to, e.g., an illuminating device such as a backlight device.

In the above description, the mask is moved in the vertical direction or in both the vertical direction and the horizontal direction with respect to the (TFT) substrate. However, the present invention is not limited thereto, and the mask may be moved in at least one direction of the vertical direction and the horizontal direction with respect to the substrate.

Figure 12:
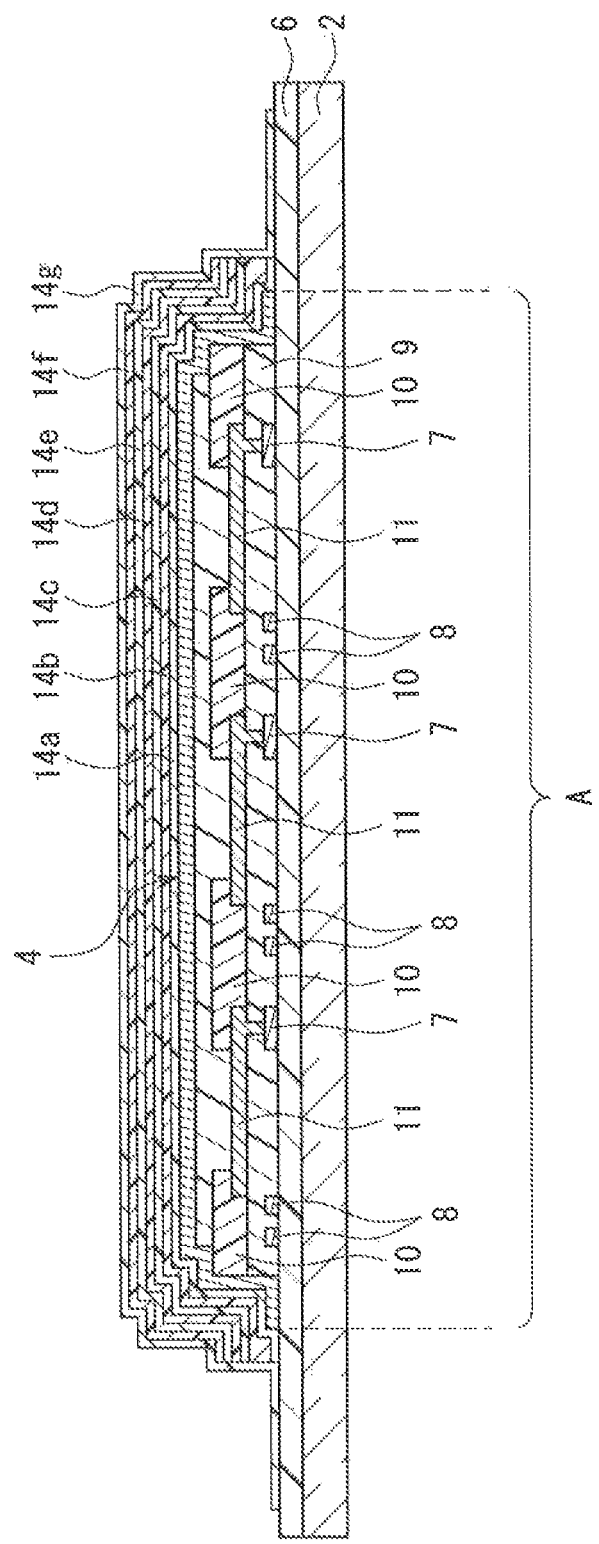
FIG. 12 is a cross-sectional view showing the main configuration of an organic EL display device of a first modified example of the present invention.
Figure 13:
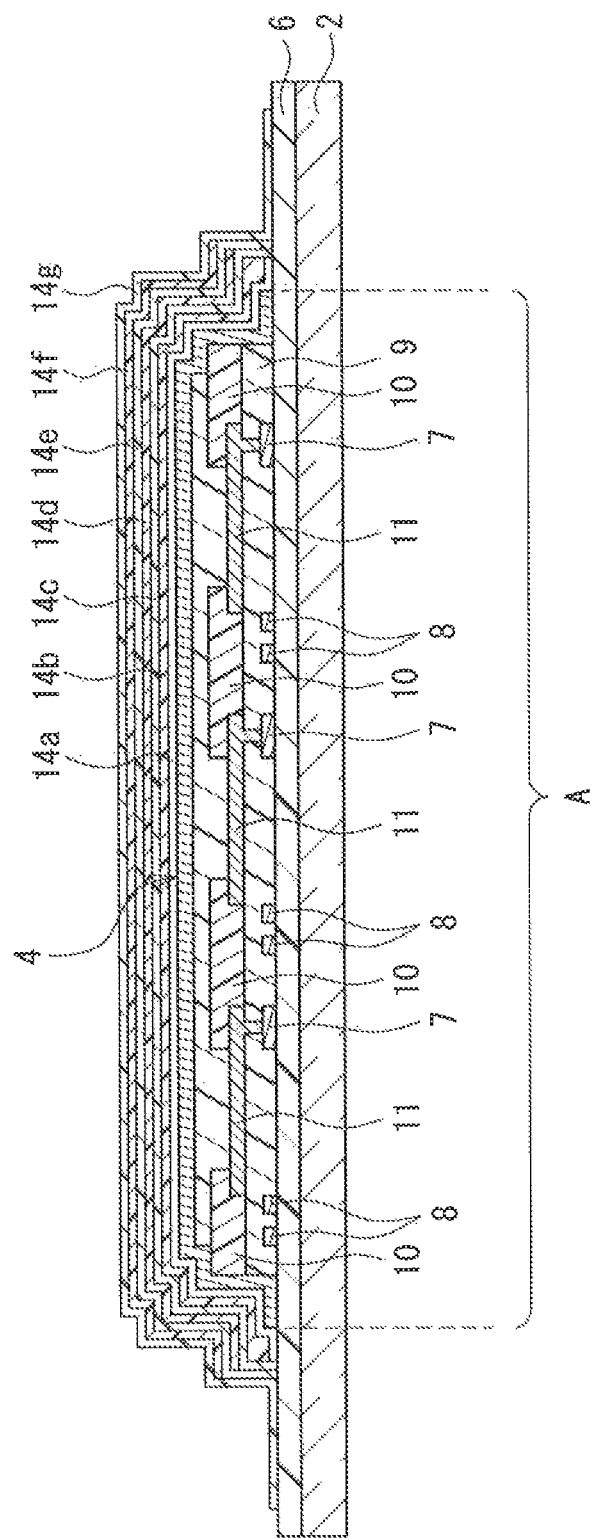
FIG. 13 is a cross-sectional view showing the main configuration of an organic EL display device of a second modified example of the present invention.

In the above description, the first to third sealing films are provided. However, the present invention is not limited thereto, and may have any configuration that includes a sealing film covering the electroluminescent element and another sealing film covering this sealing film. For example, the electroluminescent element may be covered with, e.g., 5, 7, or 9 sealing films. Specifically, when 7 sealing films are used, as shown in FIG. 12, a seventh-layer inorganic film 14g may cover a first-layer inorganic film 14a, a second-layer inorganic film 14b, a third-layer inorganic film 14c, a fourth-layer inorganic film 14d, a fifth-layer inorganic film 14e, and a sixth-layer inorganic film 14f. Alternatively, as shown in FIG. 13, the third-layer inorganic film 14c may cover the first-layer inorganic film 14a and the second-layer organic film 14b; the fifth-layer inorganic film 14e may cover the first-layer inorganic film 14a, the second-layer organic film 14b, the third-layer inorganic film 14c, and the fourth-layer organic film 14d; and the seventh-layer inorganic film 14g may cover the first-layer inorganic film 14a, the second-layer organic film 14b, the third-layer inorganic film 14c, the fourth-layer organic film 14d, the fifth-layer inorganic film 14e, and the sixth-layer organic film 14f.

As described in each of the above embodiments, the configuration that includes at least a first inorganic sealing film, a second organic sealing film, and a third inorganic sealing film is preferred because each of the first to third sealing films can easily be made suitable. When the first sealing film covering the electroluminescent element is an organic film, components such as moisture and oxygen contained in the organic film itself may have an adverse effect on the electroluminescent element. On the other hand, when the first sealing film is an inorganic film, the electroluminescent element can be appropriately sealed (protected), since the first sealing film does not contain any components such as moisture and oxygen that may have an adverse effect on the electroluminescent element. When the second sealing film is an organic film, even if there is unevenness such as pinholes or cracks in the first inorganic sealing film, the unevenness can easily be smoothed. When the third sealing film is an inorganic film, it is easy to prevent moisture and oxygen from entering the electroluminescent element from the end faces of the first and second sealing films (i.e., the laminated film). This can more reliably prevent the degradation of the electroluminescent element due to moisture and oxygen.

Other than the above description, Embodiments 1 to 3 may be combined as needed.

INDUSTRIAL APPLICABILITY

The present invention is useful for a low-cost electroluminescent device that can reliably prevent the degradation of an electroluminescent element due to moisture and oxygen, an apparatus for manufacturing the electroluminescent device, and a method for manufacturing the electroluminescent device.

DESCRIPTION OF REFERENCE NUMERALS

1 Organic EL display device
2 TFT substrate (substrate)
3 Counter substrate
4 Organic EL element (electroluminescent element)
5 Sealing material
14a First sealing film
14b Second sealing film
14c Third sealing film
15 Desiccant layer
M1, M2 Mask
M1a, M2a Opening
E1, E2 Electrode (film forming portion)
H1 Gas supply portion (film forming portion)
H1a Gas supply hole (film forming portion)
H2 Vacuum exhaust portion (film forming portion)
Md Mask moving member

The invention claimed is:
1. An electroluminescent device comprising:
a substrate;
an electroluminescent element provided on the substrate;
an underlying film between the substrate and the electroluminescent element;
a first sealing film that covers the electroluminescent element;
a second sealing film on the first sealing film;
a third sealing film that covers the first sealing film and the second sealing film; and
a sealing material having a frame shape that surrounds the electroluminescent element, wherein
the third sealing film contacts end faces of the first sealing film and the second sealing film,
the third sealing film contacts the underlying film around the electroluminescent element,
the end face of the first sealing film is located at a same position as the end face of the second sealing film, the first sealing film and the third sealing film are positioned such that the second sealing film is prevented from contacting the underlying film, the underlying film extends outward beyond the sealing material so that the underlying film covers the substrate, the first sealing film and the second sealing film are arranged inside the sealing material, and the third sealing film contacts the sealing material and the underlying film.

2. The electroluminescent device according to claim 1, wherein the third sealing film is formed of an inorganic film.

3. The electroluminescent device according to claim 1, wherein the first sealing film and the third sealing film are formed of inorganic films, and the second sealing film is formed of an organic film.

4. The electroluminescent device according to claim 1, comprising:

a counter substrate that is located on an opposite side of the electroluminescent element with respect to the substrate, wherein the sealing material seals the electroluminescent element between the substrate and the counter substrate.

5. The electroluminescent device according to claim 4, wherein a desiccant layer is provided between the substrate, the counter substrate, and the sealing material.

6. The electroluminescent device according to claim 4, wherein the sealing material overlaps with the third sealing film, and the end faces of the first sealing film and the second the sealing film are arranged inside the sealing material so as to define a frame.

7. The electroluminescent device according to claim 4, wherein the third sealing film is between the sealing material and the underlying film.

8. The electroluminescent device according to claim 4, wherein the third sealing film is inside the sealing material.

9. The electroluminescent device according to claim 1, wherein the first sealing film contacts the underlying film.

10. The electroluminescent device according to claim 1, wherein the electroluminescent element includes an organic electroluminescent (EL) layer and an electrode that is located on an opposite side of the organic EL layer with respect to the substrate and covers the organic EL layer, and the electrode contacts the underlying film.

11. The electroluminescent device according to claim 1, wherein the third sealing film contacts the underlying film inside the sealing material.

12. The electroluminescent device according to claim 11, wherein the first sealing film contacts the underlying film inside a position where the third sealing film contacts the underlying film.

13. The electroluminescent device according to claim 1, wherein an end face of the third sealing film is located at a same position as an outer peripheral surface of the sealing material.

* * * * *